(12) United States Patent
Mao et al.

(10) Patent No.: US 12,159,952 B2
(45) Date of Patent: Dec. 3, 2024

(54) PHOTOVOLTAIC CELL AND PHOTOVOLTAIC MODULE

(71) Applicant: JINKO SOLAR (HAINING) CO., LTD., Jiaxing (CN)

(72) Inventors: Jie Mao, Jiaxing (CN); Menglei Xu, Jiaxing (CN); Peiting Zheng, Jiaxing (CN); Jie Yang, Jiaxing (CN); Xinyu Zhang, Jiaxing (CN)

(73) Assignee: JINKO SOLAR (HAINING) CO., LTD., Jiaxing (CN)

( * ) Notice: Subject to any disclaimer, the term of this patent is extended or adjusted under 35 U.S.C. 154(b) by 203 days.

(21) Appl. No.: 17/859,975

(22) Filed: Jul. 7, 2022

(65) Prior Publication Data

US 2023/0395740 A1 Dec. 7, 2023

(30) Foreign Application Priority Data

Jun. 1, 2022 (CN) .......................... 202210611082.8
Jun. 1, 2022 (CN) .......................... 202210611083.2

(51) Int. Cl.
*H01L 31/06* (2012.01)
*H01L 31/0352* (2006.01)
*H01L 31/05* (2014.01)

(52) U.S. Cl.
CPC ...... *H01L 31/06* (2013.01); *H01L 31/035272* (2013.01); *H01L 31/0504* (2013.01)

(58) Field of Classification Search
CPC ............. H01L 31/06; H01L 31/035272; H01L 31/0504; H01L 31/0747; H01L 31/072; H01L 31/074
See application file for complete search history.

(56) References Cited

U.S. PATENT DOCUMENTS

2016/0126400 A1  5/2016  Ji et al.
2017/0005218 A1  1/2017  Chang et al.
(Continued)

FOREIGN PATENT DOCUMENTS

CN  102110721 A  6/2011
CN  103199152 A  7/2013
(Continued)

OTHER PUBLICATIONS

CN 103199152A English machine translation (Year: 2013).*
(Continued)

*Primary Examiner* — Andrew J Golden
(74) *Attorney, Agent, or Firm* — USCH Law, PC

(57) ABSTRACT

A photovoltaic cell is provided, including: a substrate; a tunneling layer, a field passivation layer and a first passivation film that are sequentially disposed on a rear surface of the substrate; and a first electrode. The first electrode penetrates the first passivation film and is in contact with the field passivation layer. A doping concentration of the first doping element in the tunneling layer is less than a doping concentration of the first doping element in the field passivation layer, and the doping concentration of the first doping element in the tunneling layer is greater than a doping concentration of the first doping element in the substrate. The field passivation layer includes a first doped region and a second doped region, and a doping curve slope of the first doped region is greater than a doping curve slope of the second doped region.

17 Claims, 3 Drawing Sheets

(56) References Cited

U.S. PATENT DOCUMENTS

| | | | |
|---|---|---|---|
| 2020/0279970 A1 | 9/2020 | Naber et al. | |
| 2020/0287065 A1* | 9/2020 | Stodolny | H01L 31/0745 |
| 2020/0313010 A1* | 10/2020 | Nanba | H01L 31/0747 |

FOREIGN PATENT DOCUMENTS

| | | | |
|---|---|---|---|
| CN | 103515477 A | 1/2014 | |
| CN | 103606596 A | 2/2014 | |
| CN | 103618028 A | 3/2014 | |
| CN | 204792818 U | 11/2015 | |
| CN | 105895738 A | 8/2016 | |
| CN | 106784128 A | 5/2017 | |
| CN | 107046073 A | 8/2017 | |
| CN | 108258082 A | 7/2018 | |
| CN | 109285896 A | 1/2019 | |
| CN | 110047972 A | 7/2019 | |
| CN | 110165017 A | 8/2019 | |
| CN | 110890445 A | 3/2020 | |
| CN | 111133589 A | 5/2020 | |
| CN | 111509055 A | 8/2020 | |
| CN | 111509057 A | 8/2020 | |
| CN | 111739982 A | 10/2020 | |
| CN | 111883420 A | 11/2020 | |
| CN | 112071951 A | 12/2020 | |
| CN | 112635583 A | 4/2021 | |
| CN | 113035969 A | 6/2021 | |
| CN | 113241308 A | 8/2021 | |
| CN | 113555469 A | 10/2021 | |
| CN | 114023635 A | 2/2022 | |
| CN | 114188436 A | 3/2022 | |
| CN | 115394881 A | 11/2022 | |
| JP | 2010533969 A | 10/2010 | |
| JP | 2013243358 A | 12/2013 | |
| JP | 2014146766 A | 8/2014 | |
| JP | 2015015472 A | 1/2015 | |
| JP | 2017017323 A | 1/2017 | |
| JP | 2017208569 A | 11/2017 | |
| JP | 2018195649 A | 12/2018 | |
| JP | 2019033298 A | 2/2019 | |
| JP | 2022081367 A | 5/2022 | |
| NL | 2018356 B1 | 9/2018 | |
| WO | 2017018300 A1 | 2/2017 | |
| WO | 2017182472 A1 | 10/2017 | |

OTHER PUBLICATIONS

Sheng, Jian, et al., "Impact of phosphorus diffusion on n-type poly-Si based passivated contact silicon solar cells", Solar Energy Materials and Solar Cells, vol. 203, Article No. 110120, 2019, 8 pgs.

Baek, Jong Hoon, et al., "Passivation improvement of nitric acid oxide by ozone post-treatment for tunnel oxide passivated contacts silicon solar cells", Applied Surface Science, vol. 489, 2019, 6 pgs.

Wang, Qinqin, et al., "Influence of SiOx film thickness on electrical performance and efficiency of TOPCon solar cells", Solar Energy Materials and Solar Cells, vol. 208, 2020, 9 pgs.

Qiang Li, et al., Replacing the amorphous silicon thin layer with microcrystalline silicon thin layer in TOPCon solar cells, Solar Energy, 2016, vol. 135, 2016, 6 pgs.

Ajeet Rohatgi, et al., Fabrication and Modeling of High-Efficiency Front Junction N-Type Silicon Solar Cells with Tunnel Oxide Passivating Back Contact, IEEE Journal of Photovoltaics, 2017, vol. 7, 2016, 8 pgs.

George C. Wilkes, et al., Laser Crystallization and Dopant Activation of a-Si:H Carrier-Selective Layer in TOPCon Si Solar Cells, IEEE Journal of Photovoltaics, 2020, vol. 10, 2020, 7 pgs.

Adeline Lanterne, et al., Solar-grade boron emitters by BF3 plasma doping and role of the co-implanted fluorine, Progress in Photovoltaics, 2016, vol. 24, 2016, 9 pgs.

Kin Lyu, et al., Influence of Back Surface Doping Concentration on n-TYPE TOPCon Solar Cells, Acta Energiae Solaris Sinica, vol. 42, No. 11, 2021-11, 6 pgs.

Jinko Solar (Haining) Co., Ltd., CN First Office Action with English translation, CN 202210611083.2, Jul. 19, 2022, 29 pgs.

Jinko Solar (Haining) Co., Ltd., CN Intention to Grant with English translation, CN 202210611083.2, Aug. 23, 2022, 7 pgs.

Jinko Solar (Haining) Co., Ltd., CN First Office Action with English translation, CN 202210611082.8, Jul. 19, 2022, 21 pgs.

Jinko Solar (Haining) Co., Ltd., CN Intention to Grant with English translation, CN 202210611082.8, Aug. 15, 2022, 6 pgs.

Jinko Solar (Haining) Co., Ltd., Extended European Search Report, EP 22181369.4, Nov. 23, 2022, 7 pgs.

Jinko Solar (Haining) Co., Ltd., GB First Office Action, GB 2218026.9, Jan. 9, 2023, 5 pgs.

* cited by examiner

PHOTOVOLTAIC CELL AND PHOTOVOLTAIC MODULE

CROSS-REFERENCE TO RELATED APPLICATION

The present application claims the benefit of priorities under the Paris Convention to Chinese Patent Application No. 202210611082.8 filed on Jun. 1, 2022 and Chinese Patent Application No. 202210611083.2 filed on Jun. 1, 2022, each of which is incorporated herein by reference in its entirety.

TECHNIC FIELD

Embodiments of the present disclosure relate in general to photovoltaic technology, and more specifically to a photovoltaic cell and a photovoltaic module.

BACKGROUND

Conventional fossil fuels of photovoltaic modules are increasingly depleted, and solar energy is undoubtedly the cleanest, most common and most promising alternative energy sources among all sustainable energy sources. Generally, among all the photovoltaic cells, crystalline silicon photovoltaic cells are one of the most widely commercially available photovoltaic cells, since silicon is extremely abundant in the crust and the crystalline silicon photovoltaic cells have excellent electrical and mechanical properties compared with other types of photovoltaic cells. Therefore, the crystalline silicon photovoltaic cells play an important role in photovoltaic field.

With the development of photovoltaic cell technology, recombination loss of the metal contact region becomes one of important factors which restrict further improvement of conversion efficiency of the photovoltaic cell. In order to improve the conversion efficiency of the photovoltaic cell, the photovoltaic cell is passivated by passivated contact to reduce recombination of an interior and a surface of the photovoltaic cell. Conventional passivation contact cells include heterojunction with intrinsic thin-layer (HIT) cells and tunnel oxide passivated contact (TOPCon) cells. However, conversion efficiency of existing passivated contact cells requires to be improved.

SUMMARY

Some embodiments of the present disclosure provide a photovoltaic cell and a photovoltaic module, which improve passivation effect and conversion efficiency of the photovoltaic cell.

Some embodiments of the present disclosure provide a photovoltaic cell including: a substrate; a tunneling layer, a field passivation layer, and a first passivation film that are sequentially disposed on a rear surface of the substrate; and a first electrode, where the first electrode penetrates the first passivation film and is in contact with the field passivation layer; where each of the substrate, the tunneling layer and the field passivation layer includes a first doping element, a doping concentration of the first doping element in the tunneling layer is less than a doping concentration of the first doping element in the field passivation layer, and the doping concentration of the first doping element in the tunneling layer is greater than a doping concentration of the first doping element in the substrate; where the field passivation layer includes a first doped region and a second doped region, and the second doped region is closer to the tunneling layer relative to the first doped region; where a doping curve slope of the first doped region is greater than a doping curve slope of the second doped region, the first doping element has been annealed and activated to obtain an activated first doping element, and the doping curve slope indicates a slope of a curve in which a doping concentration of the activated first doping element changes with a doping depth of the activated first doping element; and where a doping curve slope of the tunneling layer gradually decreases in a depth direction of the tunneling layer toward the substrate.

In some embodiments, a doping curve slope of the substrate gradually increases and tends to be stable in a depth direction of the rear surface of the substrate toward an interior of the substrate.

In some embodiments, the doping curve slope of the substrate is less than or equal to an average value of the doping curve slope of the second doped region.

In some embodiments, a doping concentration of the activated first doping element in the field passivation layer is in a range of $1\times10^{20}$ atom/cm$^3$ to $5\times10^{20}$ atom/cm$^3$; and an activation rate of the first doping element in the field passivation layer is in a range of 50% to 70%, and the activation rate is a ratio of the doping concentration of the activated first doping element to a concentration of the first doping element totally implanted.

In some embodiments, the doping curve slope of the first doped region is in a range of $5\times10^{18}$ to $1\times10^{19}$, and the doping curve slope of the second doped region is in a range of $-5\times10^{18}$ to $5\times10^{18}$.

In some embodiments, the doping curve slope of the tunneling layer is in a range of $-2.5\times10^{19}$ to $-2.5\times10^{18}$, and a doping curve slope of the substrate is in a range of $-2.5\times10^{19}$ to 0.

In some embodiments, a thickness of the field passivation layer is in a range of nm to 130 nm in a direction perpendicular to a surface of the substrate, and a thickness of the tunneling layer is in a range of 0.5 nm to 3 nm in the direction perpendicular to the surface of the substrate.

In some embodiments, the photovoltaic cell further includes an emitter and a second passivation film that are sequentially disposed on a front surface of the substrate; and a second electrode, where the second electrode penetrates the second passivation film and is in contact with the emitter; where the substrate further includes a second doping element.

In some embodiments, the second doping element is annealed and activated to obtain an activated second doping element, and a doping concentration of the activated second doping element on the front surface of the substrate is in a range of $5\times10^{18}$ atom/cm$^3$ to $1.5\times10^{19}$ atom/cm$^3$; and a concentration of the second doping element totally implanted is in a range of $1.5\times10^{19}$ atom/cm$^3$ to $1\times10^{20}$ atom/cm$^3$.

In some embodiments, the substrate includes a first region, a second region, and a third region in a depth direction of the front surface of the substrate toward the rear surface of the substrate; the second region is disposed between the first region and the third region, the first region is closer to the front surface of the substrate relative to the second region, and the third region is closer to the rear surface of the substrate relative to the second region; and a doping concentration of the second doping element in the second region and a doping concentration of the second doping element in the third region are both less than a doping concentration of the second doping element in the first region.

In some embodiments, a doping concentration of the activated second doping element in the first region is in a range of $5 \times 10^{18}$ atom/cm$^3$ to $1.5 \times 10^{19}$ atom/cm$^3$.

In some embodiments, a distance between a rear surface of the first region and the front surface of the substrate is in a range of 350 nm to 450 nm, a distance between a rear surface of the second region and the front surface of the substrate is in a range of 1000 nm to 1200 nm, and a distance between a rear surface of the third region and the front surface of the substrate is in a range of 1200 nm to 1600 nm.

In some embodiments, an activation rate of the second doping element in the first region is in a range of 20% to 40%, an activation rate of the second doping element in the second region is in a range of 60% to 90%, and an activation rate of the second doping element in the third region is in a range of 5% to 90%; and the activation rate is a ratio of the doping concentration of the activated second doping element to the concentration of the second doping element totally implanted.

Some embodiments of the present disclosure further provide a photovoltaic module, including: a cell string connected by a plurality of photovoltaic cells, where each of the plurality of photovoltaic cells includes the photovoltaic cell according to the above embodiments; an encapsulation layer configured to cover a surface of the cell string; and a cover plate configured to cover a surface of the encapsulation layer away from the cell string.

DETAILED DESCRIPTION OF THE EMBODIMENTS

Generally, TOPCon cells have attracted continuous attention due to their excellent surface passivation effect, high theoretical efficiency and good compatibility with conventional production lines. The most prominent feature of TOPCon technology is its high-quality laminated structure of ultra-thin silicon oxide and heavily doped polysilicon (poly-Si). Therefore, phosphorus diffusion doping is an important part of the TOPCon technology, and excellent passivated contact on a rear surface of the TOPCon cell needs to be achieved through field effect formed by the phosphorus diffusion doping.

Current study of phosphorus doping mainly focuses on the distribution of phosphorus in Poly-Si. The study on concentration change and distribution of phosphorus in Poly-Si—SiO$_x$—Si is not perfect, which is unable to essentially improve the field effect and passivated contact, so as to further improve the photovoltaic cell.

In order to improve conversion efficiency of the photovoltaic cell and essentially improve the field effect and the passivated contact, some embodiments of the present disclosure provides a photovoltaic cell in which a doping concentration of a first doping element in a field passivation layer is greater than a doping concentration of the first doping element in a tunneling layer as well as in a substrate, and the first doping element achieves a high activation rate in the field passivation layer, which is conducive to improving the passivation effect and the conversion efficiency of the photovoltaic cell. Some embodiments in the present disclosure further analyzes distribution of a doping concentration of phosphorus in Poly-Si—SiO$_x$—Si of the photovoltaic cell, thereby providing a basis for improving a phosphorus doping process and the efficiency of the photovoltaic cell.

Figure 1:
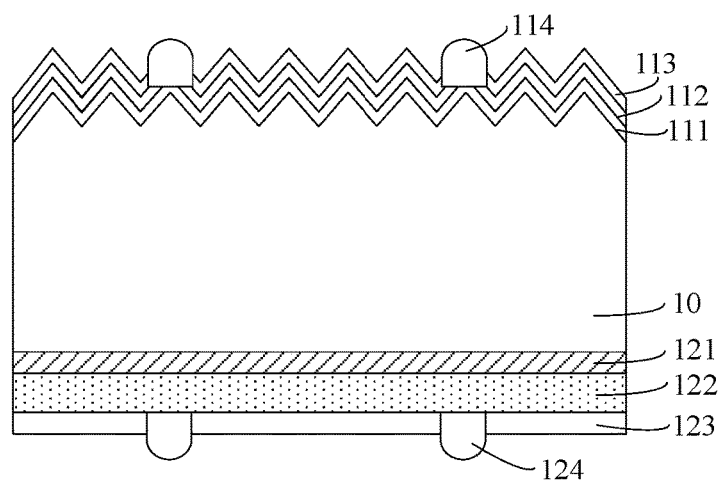
FIG. 1 is a schematic structural diagram of a photovoltaic cell according to an embodiment of the present disclosure.

Referring to FIG. 1, some embodiments of the present disclosure provide a photovoltaic cell including a substrate 10; a tunneling layer 121, a field passivation layer 122, and a first passivation film 123 that are sequentially disposed on a rear surface of the substrate and a first electrode 124. The first electrode 124 penetrates the first passivation film 123 and is in contact with the field passivation layer 122. The substrate 10, the tunneling layer 121 and the field passivation layer 122 all include a same first doping element, a doping concentration of the first doping element in the tunneling layer 121 is less than a doping concentration of the first doping element in the field passivation layer 122, and the doping concentration of the first doping element in the tunneling layer 121 is greater than a doping concentration of the first doping element in the substrate 10. The field passivation layer 122 includes a first doped region and a second doped region, and the second doped region is closer to the tunneling layer 121 relative to the first doped region; where a doping curve slope of the first doped region is greater than a doping curve slope of the second doped region, the first doping element is annealed and activated to obtain an activated first doping element, and the doping curve slope indicates a slope of a curve in which a doping concentration of the activated first doping element changes with a doping depth of the activated first doping element. A doping curve slope of the tunneling layer 121 gradually decreases in a depth direction of the tunneling layer 121 toward the substrate 10.

The substrate 10 is configured to receive incident light and generate photogenerated carriers. In some embodiments, the rear surface of the substrate 10 is disposed opposite a front surface of the substrate 10, and both the rear surface and the front surface of the substrate 10 may be configured to receive incident or reflected light.

In some embodiments, the substrate 10 may be a silicon substrate, and a material of the silicon substrate may include at least one of single crystal silicon, polysilicon, amorphous silicon, or microcrystalline silicon. The substrate 10 may be an N-type semiconductor substrate, i.e., the substrate 10 is doped with an N-type first doping element. The first doping element may be any one of phosphorus, arsenic, or antimony. Specifically, in the case where the first doping element is phosphorus, phosphorus diffusion may be performed on the rear surface of the substrate 10 by a doping process (e.g., thermal diffusion, ion implantation, etc.) so that the tunneling layer 121, the field passivation layer 122, and the substrate 10 are all doped with phosphorus, and phosphorus is activated by an annealing treatment to obtain activated phosphorus.

The tunneling layer 121 is configured to achieve interface passivation of the rear surface of the substrate 10 and facilitate carrier migration through a tunneling effect. In some embodiments, a deposition process may be used to form the tunneling layer 121, e.g., a chemical vapor deposition process. In some embodiments, the tunneling layer 121 may also be formed using an in-situ generation process. Specifically, the tunneling layer 121 may include a dielectric material that provides passivation and tunneling effects, such as oxides, nitrides, semiconductors, conductive polymers, etc. For example, a material of the tunneling layer 121 may include at least one of silicon oxide, silicon nitride, silicon oxynitride, intrinsic amorphous silicon, intrinsic polysilicon, etc. In some examples, the tunneling layer 121 may not be a perfect tunneling barrier in practice because the tunneling layer 121 may include defects such as pinholes, resulting in other charge carrier transmission mechanisms, such as drift, diffusion, to dominate over the tunneling effect.

The field passivation layer 122 is configured to form field passivation. In some embodiments, a material of the field passivation layer 122 may be doped silicon. Specifically, in some embodiments, the field passivation layer 122 may have a doping element of the same conductivity type as the substrate 10, and the doped silicon may include one or more of N-type doped polysilicon, N-type doped microcrystalline silicon, or N-type doped amorphous silicon. As an improvement, the material of the field passivation layer 122 is a phosphorus-doped polysilicon layer. In some embodiments, a deposition process may be used to form the field passivation layer 122. Specifically, the intrinsic polysilicon may be deposited on a rear surface of the tunneling layer 121 away from the substrate 10 to form a polysilicon layer, and the first doping element is doped by ion implantation and source diffusion to form an N-type doped polysilicon layer as the field passivation layer 122. In some embodiments, N-type doped amorphous silicon may be formed on the rear surface of the tunneling layer 121 away from the substrate 10 first, and the N-type doped polysilicon layer is then formed after the N-type doped amorphous silicon is subjected to a high temperature treatment.

Referring to FIG. 1, the first passivation film 123 is a rear passivation film forming on a side of the field passivation layer 122 away from the rear surface of the substrate 10. In some embodiments, a material of the first passivation film 123 may be one or more of silicon oxide, aluminum oxide, silicon nitride, silicon oxynitride, or silicon oxycarbonitride. Specifically, in some embodiments, the first passivation film 123 may be a single layer structure. In some embodiments, the first passivation film 123 may also be a multilayer structure. In some embodiments, a plasma enhanced chemical vapor deposition (PECVD) method may be used to form the first passivation film 123.

The first passivation film 123 passivates defects present in the field passivation layer 122 on the rear surface of the substrate 10 and removes minority recombination portions of carriers, thereby increasing an open-circuit voltage of the photovoltaic cell. In addition, a first antireflection film may be further provided on a side of the first passivation film 123 away from the rear surface of the substrate 10, and the first antireflection film reduces reflectance of light incident on the rear surface of the substrate 10, so as to increase the amount of light reaching a tunnel junction formed by the substrate 10 and the tunneling layer 121, thereby increasing a short-circuit current (Isc) of the photovoltaic cell. Therefore, the first passivation film 123 and the first antireflection film are able to increase the open-circuit voltage and the short-circuit current of the photovoltaic cell, thereby improving the conversion efficiency of the photovoltaic cell.

In some embodiments, the first antireflection film may be formed from various materials capable of preventing reflection of the surface. For example, a material of the first antireflection film may be one or more of silicon nitride, silicon nitride containing hydrogen, silicon oxide, silicon oxynitride, aluminum oxide, $MgF_2$, ZnS, $TiO_2$ or $CeO_2$. Specifically, in some embodiments, the first antireflection film may be a single layer structure. In some embodiments, the first antireflection film may also be a multilayer structure. In some embodiments, the first antireflection film may be formed using the PECVD method.

In some embodiments, the first electrode 124 penetrates the first passivation film 123 to be electrically connected to the field passivation layer 122. Specifically, the first electrode 124 is electrically connected to the field passivation layer 122 via an opening formed in the first passivation film 123 (i.e., at the time the first electrode 124 penetrates the first passivation film 123).

In some embodiments, the operation of forming the first electrode 124 may include printing a conductive paste on a surface of the first passivation film 123 in a preset region, and a conductive material in the conductive paste may include at least one of silver, aluminum, copper, tin, gold, lead, or nickel. The conductive paste may be sintered, for example, at a peak temperature of 750° C. to 850° C., to form the first electrode 124.

Figure 2:
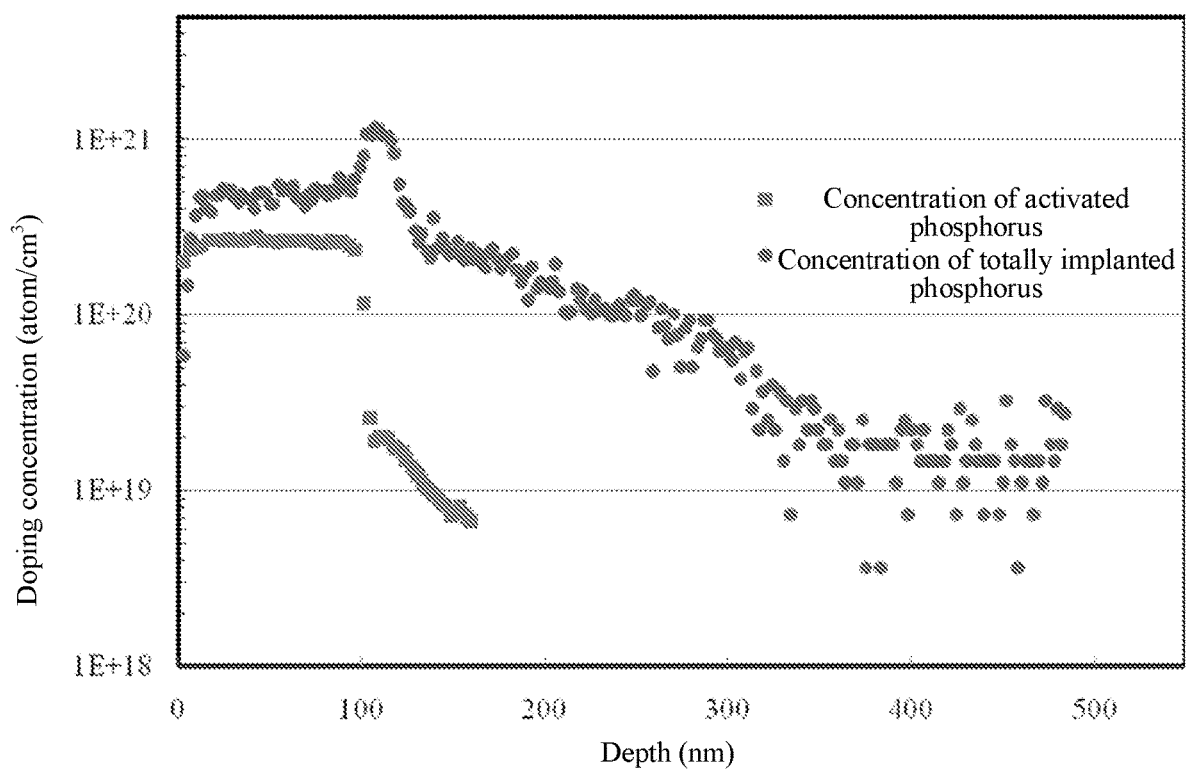
FIG. 2 is a curve graph showing a doping concentration of a first doping element varying with a doping depth of the first doping element in a photovoltaic cell according to an embodiment of the present disclosure.

In some embodiments, for the photovoltaic cell shown in FIG. 1, in the case where the first doping element is phosphorus, a concentration of activated phosphorus and a concentration of totally implanted phosphorus in a phosphorus diffusion doping process may be measured by an electrochemical capacitance voltage (ECV) method and a secondary ion mass spectrometry (SIMS) method, to obtain a distribution curve of the concentration of activated phosphorus and the concentration of the totally implanted phosphorus changing with doping depth, as shown in FIG. 2. As is seen from FIG. 2, the distribution trend of the doping concentration of the total implanted phosphorus in the field passivation layer 122, the tunneling layer 121, and the substrate 10 gradually decreases. In the field passivation layer 122 (a Poly-Si film), the concentration of the activated phosphorus is about $3\times10^{20}$ atom/$cm^3$, the concentration of the totally implanted phosphorus is about $5\times10^{20}$ atom/$cm^3$, and an activation rate of phosphorus is in a range of 50% to 70%, thereby achieving a high probability of phosphorus activation.

Referring to FIG. 2, the field passivation layer 122 includes a first doped region having a high doping concentration and a second doped region having a lower doping concentration than the first doped region, thereby improving the passivation effect when light is incident on the field passivation layer 122. Meanwhile, a contact resistance between the field passivation layer 122 and the first electrode 124 is reduced, thereby improving the conversion efficiency of the photovoltaic cell.

As shown in FIG. 2, there is an obvious doping concentration peak in the concentration spectrum of the totally implanted phosphorus obtained by secondary ion mass spectrometry (SIMS) test, because the chemical environment of phosphorus changes on both sides of an interface between the field passivation layer 122 and the tunneling layer 121 (a Poly-Si—SiO$_x$ film), which affects ionicity of phosphorus. In particular, there is abundant oxygen in the SiO$_x$ film of the tunneling layer 121, which increases signal strength of phosphorus in a positive ion test mode of SIMS, resulting in a high doping concentration obtained through the test. However, when a depth of the test reaches a single crystal silicon layer in which the substrate 10 is disposed, the signal strength tends to be stable.

As an example, combining ECV and SIMS tests, it is found that interface depths of Poly-Si—SiO$_x$ and SiO$_x$—Si are about 94 nm and 101 nm, respectively. As shown in FIG. 2, the concentration of the totally implanted phosphorus from a surface layer of the field passivation layer 122 to the tunneling layer 121 (i.e., the interface depth is in a range of 0 nm to 94 nm) is about $5 \times 10^{20}$ atom/cm$^3$, and the change trend is stable. At an interface depth of about 94 nm, the concentration of the totally implanted phosphorus starts to fluctuate, and there is a doping concentration peak in an interval between an interface depth of about 94 nm and an interface depth of about 101 nm. However, after the interface depth is greater than 101 nm, the concentration of the totally implanted phosphorus gradually decreases and becomes stable at an interface depth of about 310 nm. At an interval between an interface depth of 310 nm and an interface depth of 500 nm, the concentration of the totally implanted phosphorus is in a range of $5 \times 10^{18}$ atom/cm$^3$ to $5 \times 10^{19}$ atom/cm$^3$. The concentration of the activated phosphorus from the surface layer of the field passivation layer 122 to the tunneling layer 121 (i.e., the interface depth is in a range of 0 nm to 94 nm) is about $3 \times 10^{20}$ atom/cm$^3$, and the change trend is stable. At the interface depth of about 94 nm, the concentration of the activated phosphorus decreases greatly. After the interface depth is greater than 101 nm, the concentration of the activated phosphorus decreases slowly and reaches the lowest value at an interface depth of about 160 nm.

It should be noted that the doping curve is a relationship between a doping concentration (in a unit of atom/cm$^3$) of phosphorus and a doping depth (in a unit of nm) of phosphorus. The doping curve slope is a slope of a doping concentration of annealed and activated phosphorus changing with the doping depth of the annealed and activated phosphorus.

Figure 3:
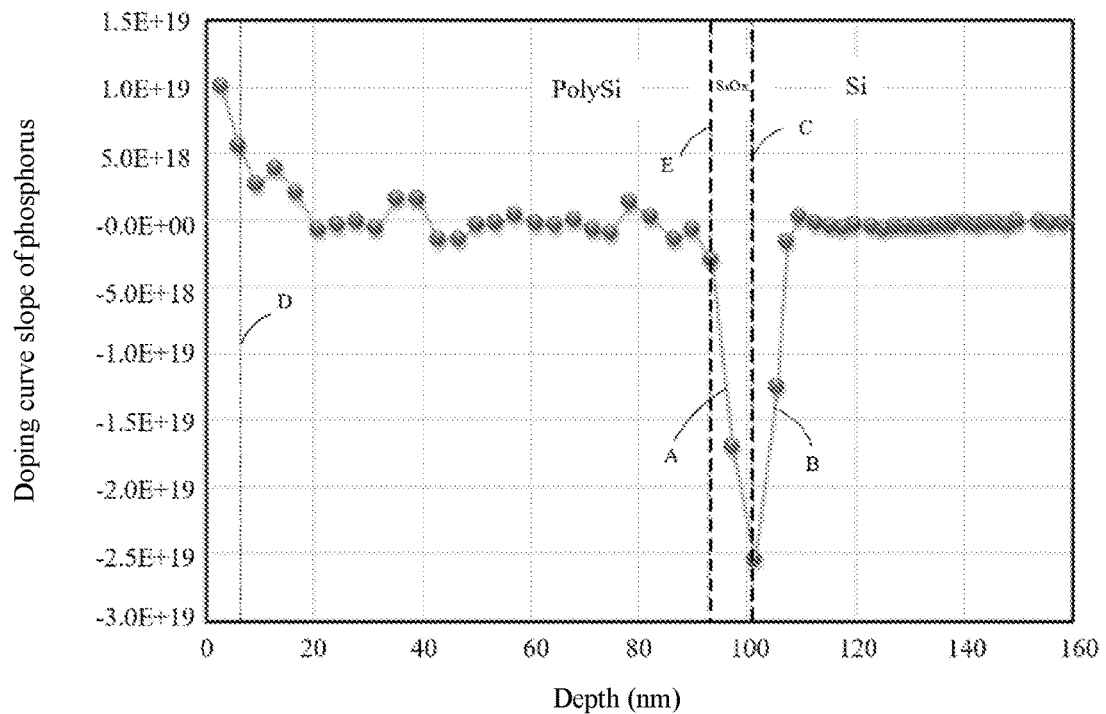
FIG. 3 is a distribution diagram showing a doping curve slope of a first doping element changing with a doping depth of the first doping element in a photovoltaic cell according to an embodiment of the present disclosure.

FIG. 3 shows gradient distribution of the doping curve slope of phosphorus changing with the doping depth of phosphorus, in which the change of the doping concentration of phosphorus in the TOPCon structure is able to be analyzed more clearly. As shown in FIG. 3, the boundary between the first doped region and the second doped region is shown as a dashed line D, the boundary between the tunneling layer 121 (a SiO$_x$ film) and the second doped region is shown as a dashed line E, and the boundary between the tunneling layer 121 and the substrate 10 is shown as a dashed line C. The doping curve slope of phosphorus decreases greatly in the first doped region of the field passivation layer 122 (the Poly-Si film), and the doping curve slope of phosphorus decreases slowly in the second doped region and then becomes stable near zero, which indicates that the doping concentration of phosphorus in the first doped region of the field passivation layer 122 (also referred to as a Poly-Si layer) changes greatly, and the doping concentration of phosphorus in the first doped region of the field passivation layer 122 tends to be stable subsequently. In the tunneling layer 121 (the SiO$_x$ film), the doping curve slope of phosphorus is negative and decreases greatly, which indicates that the doping concentration of phosphorus decreases gradually and a decrement range becomes large.

In some embodiments, a doping curve slope of the substrate 10 gradually increases and tends to be stable as the rear surface of the substrate 10 faces an interior of the substrate 10. As shown in FIG. 3, as the interface depth of the substrate 10 increases, the doping curve slope of phosphorus in the substrate 10 gradually increases and tends to be stable, which indicates that a decrement range of the doping concentration of phosphorus in the substrate 10 becomes small and gradually tends to be stable.

In some embodiments, the doping curve slope of the substrate 10 is less than or equal to an average value of the doping curve slope of the second doped region. With continued reference to FIG. 3, the doping curve slope of the substrate 10 gradually increases and tends to a stable value that is approximately equal to the average value of the doping curve slope of the second doped region.

In some embodiments, the doping concentration of the activated first doping element in the field passivation layer 122 is in a range of $1 \times 10^{20}$ atom/cm$^3$ to $5 \times 10^{20}$ atom/cm$^3$. An activation rate of the first doping element in the field passivation layer 122 is in a range of 50% to 70%. The activation rate is a ratio of the doping concentration of the activated first doping element to a concentration of totally implanted first doping element.

As shown in FIG. 2, in the case where the first doping element is phosphorus, a doping concentration of the activated phosphorus in the field passivation layer 122 may be $1 \times 10^{20}$ atom/cm$^3$, $2 \times 10^{20}$ atom/cm$^3$, $3 \times 10^{20}$ atom/cm$^3$, $4 \times 10^{20}$ atom/cm$^3$ or $5 \times 10^{20}$ atom/cm$^3$. As an improvement, the doping concentration of the activated phosphorus in the field passivation layer 122 may be $3 \times 10^{20}$ atom/cm$^3$, the concentration of the totally implanted phosphorus is about $5 \times 10^{20}$ atom/cm$^3$, and the activation rate of the first doping element in the field passivation layer 122 is in a range of 50% to 70%, thereby achieving a higher probability of phosphorus activation.

In some embodiments, the doping curve slope of the first doped region is in a range of $5 \times 10^{18}$ to $1 \times 10^{19}$. The doping curve slope of the second doped region is in a range of $-5 \times 10^{18}$ to $5 \times 10^{18}$.

As shown in FIG. 3, a region from a surface layer of the field passivation layer 122 to the interface depth of about 10 nm of the field passivation layer 122 is denoted as a first doped region, and the doping curve slope of the first doped region decreases greatly. In the second doped region, the doping curve slope first decreases smoothly (the interface depth is in a range of 10 nm to 20 nm), and the doping curve slope tends to be stable at the interface depth of about 20 nm, and is always in a stable state and continues to the interface position of the Poly-Si—SiOx thin film (the interface depth is about 94 nm).

In some embodiments, the doping curve slope of the tunneling layer 121 is in a range of $-2.5 \times 10^{19}$ to $-2.5 \times 10^{18}$. The doping curve slope of the substrate 10 is in a range of $-2.5 \times 10^{19}$ to 0.

With continued reference to FIG. 3, the doping curve slope begins to decrease greatly (as shown at A in FIG. 3) from $2.5 \times 10^{18}$ to $-2.5 \times 10^{19}$ in an interface depth range from the tunneling layer 121 to the substrate 10, i.e., the interface depth range from the SiO$_x$ film to the crystalline silicon surface layer in FIG. 3. This is mainly because the chemical environment of phosphorus changes when phosphorus enters the SiO$_x$ film from the Poly-Si film, which affects the ionicity of phosphorus, thereby resulting in great decrease of the doping concentration of phosphorus. In the interface depth range from the rear surface of the substrate 10 (Si) to the front surface of the substrate 10, the doping curve slope increases greatly (as shown at B in FIG. 3) from $-2.5\times10^{19}$ to $2.5\times10^{18}$, and then the doping curve slope of phosphorus tends to be stable. It is seen from FIG. 3 that a doping curve slope at the left side of the interface of $SiO_x$—Si and a doping curve slope at the right side of the interface of $SiO_x$—Si are substantially symmetrical with respect to the dashed line C in FIG. 3, and that the doping curve slope of phosphorus that is stable in the substrate 10 is substantially equal to the average value of the doping curve slope of the second doped region, and that a center line of the doping curve slope of phosphorus in the second doped region is substantially flush with a center line of the doping curve slope of phosphorus that is stable in the substrate 10.

In some embodiments, a thickness of the field passivation layer 122 is in a range of 60 nm to 130 nm and a thickness of the tunneling layer 121 is in a range of 0.5 nm to 3 nm in a direction perpendicular to the surface of the substrate 10.

In some embodiments, in order to provide sufficient passivation and tunneling effects, the thickness of the tunneling layer 121 may be in a range of 0.5 nm to 3 nm. When the thickness of the tunneling layer 121 exceeds 3 nm, tunneling is unable to be effectively performed, and the photovoltaic cell may be unable to operate. When the thickness of the tunneling layer 121 is less than 0.5 nm, the passivation performance may deteriorate. In order to further improve the tunneling effect, the thickness of the tunneling layer 121 may be in a range of 0.5 nm to 2 nm, or the thickness of the tunneling layer 121 may be in a range of 0.5 nm to 1 nm.

In some embodiments, a thickness of the substrate 10 is in a range of 130 μm to 250 μm.

The embodiments of the present disclosure provide a photovoltaic cell and a photovoltaic module. A theoretical basis is provided for improving the field effect and the passivated contact as well as improving the efficiency of the photovoltaic cell by analyzing the activation rate and the doping curve slope of phosphorus in the phosphorus diffusion doping process of the photovoltaic cell. It is known form the above that the activation rate of phosphorus in the field passivation layer 122 is in the range of 50% to 70%, the doping curve slope of phosphorus is first decreased and then is stable in the range of $5\times10^{18}$ to $-5\times10^{18}$ in the Poly-Si film, the doping curve slope of phosphorus is decreased from about $-1\times10^{18}$ to about $-3\times10^{19}$ in the $SiO_x$ film, and the doping curve slope of phosphorus is gradually increased and is stable in the range of $-1\times10^{17}$ to $-1\times10^{18}$ in the crystalline silicon.

In some embodiments, the photovoltaic cell further includes an emitter 111 and a second passivation film 112 that are sequentially disposed on a front surface of the substrate and a second electrode 114. The second electrode 114 penetrates the second passivation film 112 and is in contact with the emitter 111. The substrate 10 further includes a second doping element.

In some embodiments, the second doping element includes at least one of boron, oxygen, silicon, chlorine, nitrogen, and carbon.

Specifically, the manufacturing process of the photovoltaic cell described above includes the following operations. First, a P-type doping source is deposited on the front surface of the substrate 10 to form a film layer. And then, the P-type doping source in the film layer of a preset region is diffused into the substrate 10 by a doping process to form the emitter 111 inside the substrate 10 of the preset region.

In some embodiments, the P-type doping source is a simple substance containing a trivalent element or a compound containing the trivalent element such as boron tribromide or boron trichloride. In some embodiments, when the P-type doping source is a boron source, the second doping element is boron. The simple substance containing the trivalent element or the compound containing the trivalent element such as boron tribromide or boron trichloride may be used as the doping source. Specifically, the second doping element in the preset region may be diffused into the front surface of the substrate 10 by a doping process, such as a laser doping process, a plasma positioning doping process, or an ion implantation process.

In some embodiments, before the film layer is formed on the front surface of the substrate 10, an operation of pretreating the front surface of the substrate 10 includes cleaning the substrate 10 and texturing the front surface of the substrate 10. Specifically, a pyramidal texture structure may be formed on the front surface of the substrate 10 by chemical etching, laser etching, mechanical etching, plasma etching, etc. On the one hand, roughness of the front surface of the substrate 10 is increased, so that the reflectivity of the front surface of the substrate 10 to the incident light is small, thereby increasing absorption utilization of the incident light. On the other hand, the presence of the pyramidal texture structure increases a surface area of the front surface of the substrate 10 compared to the front surface of the substrate 10 being a flat surface, so that more second doping elements are able to be stored in the front surface of the substrate 10, which is conductive to forming the emitter 111 with a higher concentration. In some embodiments, the emitter 111 is a doping layer diffused to a certain depth on the front surface of the substrate 10, which forms a PN junction within the substrate 10.

Referring to FIG. 1, the second passivation film 112 is a front passivation film formed on a side of the emitter 111 away from the front surface of the substrate 111. A material of the second passivation film 112 may be one or more of silicon oxide, aluminum oxide, silicon nitride, silicon oxynitride, or silicon oxycarbonitride. Specifically, in some embodiments, the second passivation film 112 may be a single layer structure. In some embodiments, the second passivation film 112 may also be a multilayer structure. In some embodiments, the second passivation film 112 may be formed using a PECVD method.

In addition, a second antireflection film may be further provided on a side of the second passivation film 112 away from the front surface of the substrate 10, and the second antireflection film reduces reflectance of light incident on the front surface of the substrate 10, so as to increase the amount of light reaching a tunnel junction formed by the substrate 10 and the emitter 111, thereby increasing a short-circuit current (Isc) of the photovoltaic cell. Therefore, the second passivation film 112 and the second antireflection film are able to increase the open-circuit voltage and the short-circuit current of the photovoltaic cell, thereby improving the conversion efficiency of the photovoltaic cell.

In some embodiments, a material of the second antireflection film is the same as that of the first antireflection film. For example, the material of the second antireflection film may be one or more of silicon nitride, silicon nitride containing hydrogen, silicon oxide, silicon oxynitride, aluminum oxide, $MgF_2$, ZnS, $TiO_2$ or $CeO_2$. Specifically, in some embodiments, the second antireflection film may be a single layer structure. In some embodiments, the second antireflection film may also be a multilayer structure. In some embodiments, the second antireflection film may be formed using the PECVD method.

In some embodiments, the second electrode 114 penetrates the second passivation film 112 to form an electrical connection with the emitter 111. Specifically, the second electrode 114 is electrically connected to the emitter 111 via an opening formed in the second passivation film 112 (i.e., at the time the second electrode 114 penetrates the second passivation film 112). Specifically, the operation of forming the second electrode 114 may be the same as the operation of forming the first electrode 124, and the material of the second electrode 114 may be the same as the material of the first electrode 124.

In some embodiments, for the photovoltaic cell shown in FIG. 1, the second doping element is annealed and activated to obtain an activated second doping element. A doping concentration of the activated second doping element on the front surface of the substrate 10 is in a range of $5\times10^{18}$ atom/cm$^3$ to $1.5\times10^{19}$ atom/cm$^3$. A concentration of the second doping element totally implanted on the front surface of the substrate 10 is in a range of $1.5\times10^{19}$ atom/cm$^3$ to $1\times10^{20}$ atom/cm$^3$.

In some embodiments, the doping concentration of the activated second doping element on the front surface of the substrate 10 may be, for example, $5\times10^{18}$ atom/cm$^3$, $9\times10^{18}$ atom/cm$^3$, $1\times10^{19}$ atom/cm$^3$, $1.2\times10^{19}$ atom/cm$^3$, or $1.5\times10^{19}$ atom/cm$^3$. The concentration of the second doping element totally implanted on the front surface of the substrate 10 may be, for example, $1.5\times10^{19}$ atom/cm$^3$, $3\times10^{19}$ atom/cm$^3$, $6\times10^{19}$ atom/cm$^3$, $8\times10^{19}$ atom/cm$^3$, or $1\times10^{20}$ atom/cm$^3$.

As an improvement, the doping concentration of the activated second doping element on the front surface of the substrate 10 is $1\times10^{19}$ atom/cm$^3$. The concentration of the second doping element totally implanted on the front surface of the substrate 10 is in a range of $3\times10^{19}$ atom/cm$^3$ to $5\times10^{19}$ atom/cm$^3$.

Figure 4:
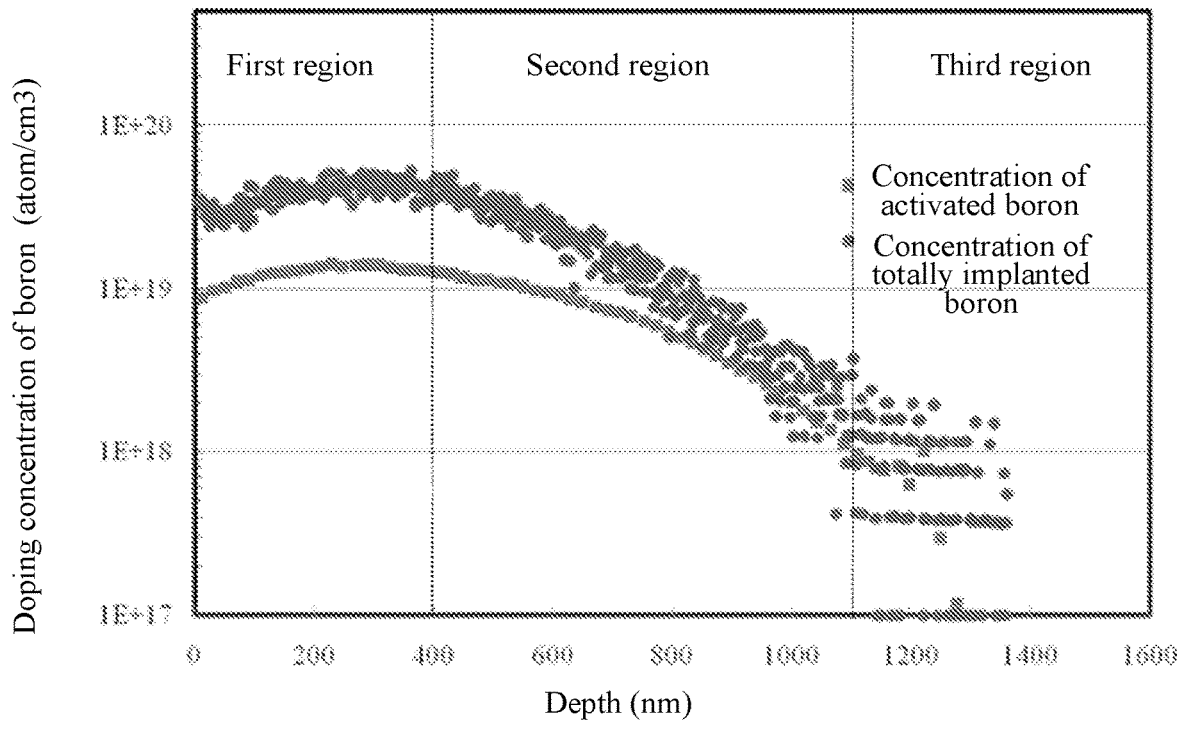
FIG. 4 is a curve graph showing a doping concentration of a second doping element changing with a doping depth of the second doping element in a photovoltaic cell according to an embodiment of the present disclosure.

In some embodiments, for the photovoltaic cell shown in FIG. 1, a distribution curve of a concentration of activated boron and a concentration of totally implanted boron changing with the doping depth is obtained by the ECV and SIMS tests, as shown in FIG. 4. It is seen from FIG. 4 that a concentration of boron totally implanted in the crystalline silicon surface layer is about $3\times10^{19}$ atom/cm$^3$. With the increase of the doping depth, the concentration of the totally implanted boron first increases and then decreases, and reaches a peak concentration of about $5\times10^{19}$ atom/cm$^3$ at a depth of about 300 nm. The concentration of the activated boron shows the same change trend as the concentration of the totally implanted boron. The concentration of the activated boron in the crystalline silicon surface layer is about $1\times10^{19}$ atom/cm$^3$ and also reaches the peak concentration at the depth of about 300 nm.

In some embodiments, the substrate 10 includes a first region, a second region, and a third region in a depth direction of the front surface of the substrate 10 toward a rear surface of the substrate 10. The second region is disposed between the first region and the third region. The first region is closer to the front surface of the substrate 10 relative to the second region, and the third region is closer to the rear surface of the substrate 10 relative to the second region. A doping concentration of the second doping element in the second region and a doping concentration of the second doping element in the third region are both less than a doping concentration of the second doping element in the first region.

In some embodiments, the doping concentration of the activated second doping element in the first region is in a range of $5\times10^{18}$ atom/cm$^3$ to $1.5\times10^{19}$ atom/cm$^3$.

In some embodiments, a distance between the rear surface of the first region and the front surface of the substrate 10 (i.e., an interface depth of the first region) is in a range of 350 nm to 450 nm. A distance between the rear surface of the second region and the front surface of the substrate (i.e., an interface depth of the second region) is in a range of 1000 nm to 1200 nm. A distance between the rear surface of the third region and the front surface of the substrate 10 (i.e., an interface depth of the third region) is in a range of 1200 nm to 1600 nm.

In some embroilments, the interface depth of the first region may be 350 nm, 370 nm, 400 nm, 430 nm, 450 nm, etc. In some embroilments, the interface depth of the second region may be 1000 nm, 1050 nm, 1100 nm, 1105 nm, 1200 nm, etc. In some embroilments, the interface depth of the third region may be 1200 nm, 1300 nm, 1400 nm, 1500 nm, 1600 nm, etc.

Figure 5:
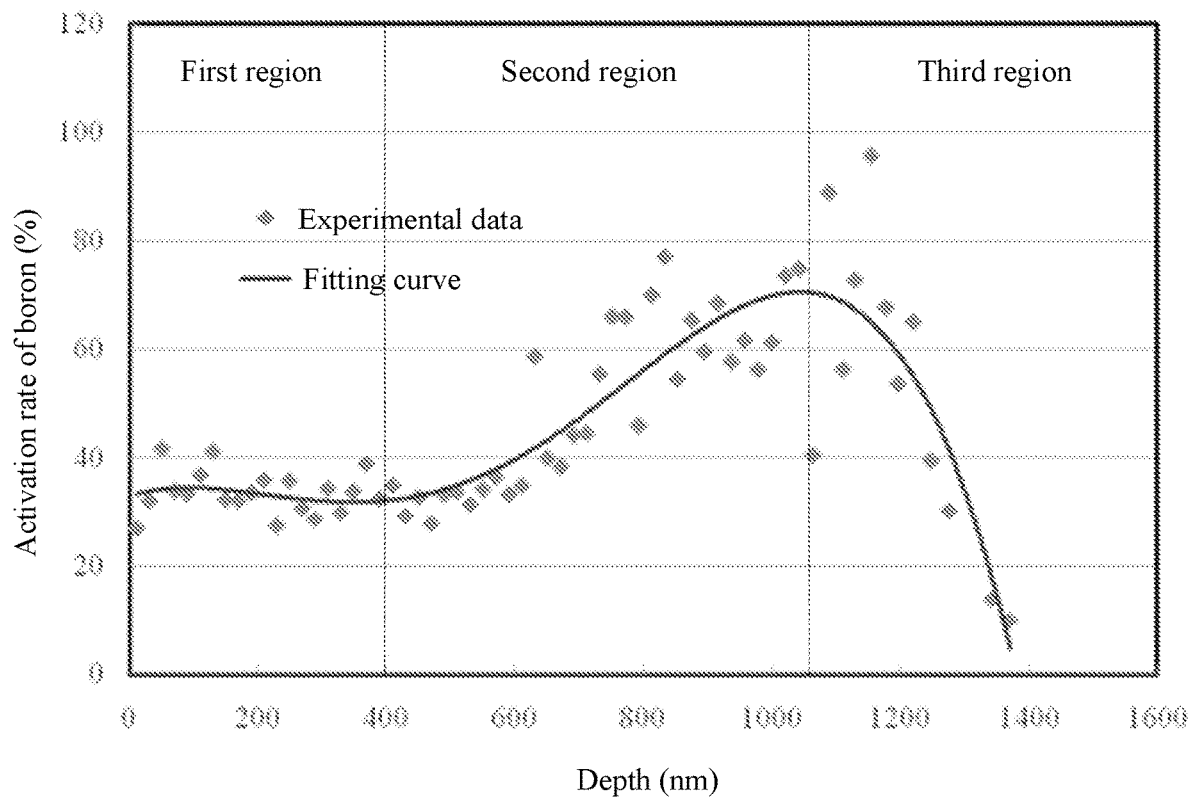
FIG. 5 is a distribution diagram showing an activation rate of a second doping element changing with a doping depth of the second doping element in a photovoltaic cell according to an embodiment of the present disclosure.

As an example, referring to FIGS. 4 and 5, the interface depth of the first region is about 400 nm, the interface depth of the second region is about 1100 nm, and the interface depth of the third region is about 1400 nm.

As shown in FIG. 4, the interface depth of the first region is about 400 nm, and a doping concentration of the activated boron in a surface layer of the first region is $1\times10^{19}$ atom/cm$^3$. As the doping depth increases, the doping concentration of the activated boron in the first region increases slowly to a highest value (the doping concentration is about $1.5\times10^{19}$ atom/cm$^3$), and then decreases slowly (the doping concentration is about $1.1\times10^{19}$ atom/cm$^3$). The doping concentration of the activated boron in the second region continues to decrease until it is near $1\times10^{18}$ atom/cm$^3$. The doping concentration of the activated boron in the third region continues to decrease to a minimum value of about $1\times10^{17}$ atom/cm$^3$.

In some embodiments, an activation rate of the second doping element in the first region is in a range of 20% to 40%, an activation rate of the second doping element in the second region is in a range of 60% to 90%, and an activation rate of the second doping element in the third region is in a range of 5% to 90%. The activation rate is a ratio of the doping concentration of the activated second doping element to the concentration of the second doping element totally implanted.

As shown in FIG. 5, in the substrate 10, boron first diffuses into the first region, then to the second region, and finally to the third region. Since the doping concentration of the surface layer of the substrate 10 is low due to the high concentration of the totally implanted boron, the activation rate of the doping element in the first region is in a range of 20% to 40%. In the second region and the third region, as the doping depth increases, the concentration of the totally implanted boron decreases and the activation rate increases. When the doping depth is greater than 1100 nm, the activation rate of boron during diffusing reaches the maximum at the doping depth of 1100 nm, which is about 90%. When the doping depth further increases, the activation rate decreases sharply and reaches the minimum at the doping depth of 1400 nm, which is about 5%.

FIG. 5 shows a gradient distribution curve of the activation rate of boron changing with the doping depth in a boron diffusion doping process. Data of activation rates of boron at different doping depths is detected for data fitting, so as to obtain a fitting curve. According to the fitting curve, the activation rate of boron in the crystalline silicon surface layer and a shallow junction region (the doping depth is less than 400 nm) is small, i.e., about 33%, which indicates that a dead layer problem is mainly concentrated in this region and is able to be adjusted by the diffusion process. When the doping depth exceeds 400 nm, the activation rate of boron increases gradually and reaches a peak at about 1100 nm, and the peak activation rate is in a range of 60% to 90%. When the doping depth further increases, the activation rate of boron decreases sharply. It is seen that the activation rate of boron in the surface layer of the substrate 10 (the doping depth is in a range of 0 nm to 400 nm) is stable, within a range of 20% to 40%. When the doping depth increases from 400 nm to 1400 nm, the activation rate of boron increases first and then decreases, and reaches a peak at the doping depth of 1000 nm to 1200 nm, and the peak activation rate is in a range of 60% to 90%.

Figure 6:
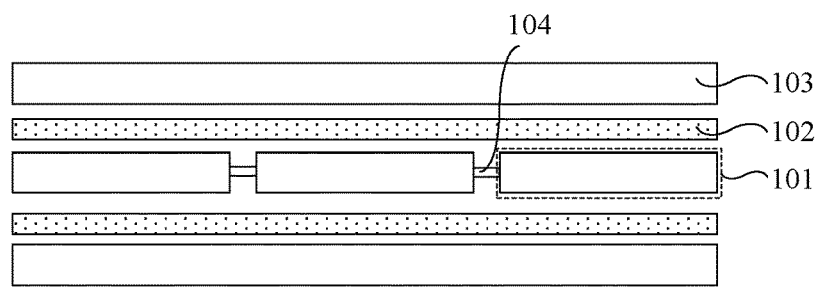
FIG. 6 is a schematic structural diagram of a photovoltaic module according to an embodiment of the present disclosure.

Referring to FIG. 6, some embodiments of the present disclosure further provide a photovoltaic module including a cell string 101, an encapsulation layer 102, and a cover plate 103. The cell string 101 is connected by a plurality of photovoltaic cells described in the above embodiments. The encapsulation layer 102 is configured to cover a surface of the cell string 101. The cover plate 103 is configured to cover a surface of the encapsulation layer 102 away from the cell string 101.

In some embodiments, the photovoltaic cells may be electrically connected as a whole or in pieces to form a plurality of cell strings 101 that are electrically connected in series and/or in parallel.

Specifically, in some embodiments, the plurality of cell strings 101 may be electrically connected to each other by a conductive tape 104. The encapsulation layer 102 covers the front side and the rear side of the photovoltaic cell. Specifically, the encapsulation layer 102 may be an organic encapsulation adhesive film such as an ethylene-vinyl acetate copolymer (EVA) adhesive film, a polyethylene octene co-elastomer (POE) adhesive film, a polyethylene terephthalate (PET) adhesive film, etc. In some embodiments, the cover plate 103 may be a glass cover, a plastic cover, or the like having a light transmitting function. Specifically, a surface of the cover plate 103 facing the encapsulation layer 102 may include a concave-convex surface, thereby increasing utilization of incident light.

Embodiments of the present disclosure provide a photovoltaic cell and a photovoltaic module. The first doping element is doped on the rear surface of the substrate 10, the second doping element is doped on the front surface of the substrate 10, the doping concentration of the first doping element in the field passivation layer is greater than that in the tunneling layer and the substrate, and a high activation rate of the first doping element is achieved in the surface layer of the field passivation layer, which is conducive to improving the passivation effect and conversion efficiency of the photovoltaic cell. In addition, the doping distribution of the second doping element in the surface layer of the substrate and the shallow junction region is improved by increasing the activation rate of the second doping element in the surface layer of the front surface of the substrate, so that influence of the dead layer is reduced, the overall performance of the photovoltaic cell is improved, and the conversion efficiency of the photovoltaic cell is improved.

Furthermore, it is known that in the manufacturing process of the photovoltaic cell, the doping process affects the quality of the PN junction and the photoelectric conversion efficiency of the photovoltaic cell.

Presently photovoltaic cells are widely concerned in the industry and production planning is gradually increasing. In order to improve the photoelectric conversion efficiency of the photovoltaic cell, the boron diffusion doping process is being studied. However, conventional boron diffusion doping processes are characterized by square resistance test, so that it is impossible to know the distribution of boron in the photovoltaic cell and a distribution relationship of the activation rate of boron changing with the doping depth in the boron diffusion doping process. For example, it is impossible to know the distribution of boron doping in the dead layer, which makes it impossible to adjust the diffusion process of the dead layer to improve the conversion efficiency of the photovoltaic cell.

In order to improve the doping distribution of boron in the photovoltaic cell as well as increase the doping concentration and activation rate of boron in a bottom layer, embodiments of the present disclosure provide a photovoltaic cell. By increasing a doping concentration and an activation rate of a first doping element on a front surface of a substrate, the doping distribution of the first doping element in a surface layer of the substrate and the shallow junction region is improved, the influence of a dead layer is reduced, overall performance of the photovoltaic cell is improved, and conversion efficiency of the photovoltaic cell is improved. It should be noted that the terms "first" and "second" herein are used only to distinguish elements and facilitate understanding of the present disclosure, which do not constitute any limitation to the present disclosure. The first doping element mentioned in this paragraph and hereinafter is the second doping element mentioned above, the second doping element mentioned in this paragraph and hereinafter is the first doping element mentioned above, the first passivation film mentioned hereinafter is the second passivation film mentioned above, the second passivation film mentioned hereinafter is the first passivation film mentioned above, the first electrode mentioned hereinafter is the second electrode mentioned above, and the second electrode mentioned hereinafter is the first electrode mentioned above.

Some embodiments provide a photovoltaic cell including: a substrate 10; an emitter 111 and a first passivation film 112 that are sequentially disposed on a front surface of the substrate 10; and a first electrode 114, where the first electrode 114 penetrates the first passivation film 112 and is in contact with the emitter 111; where the substrate 10 includes a first doping element; where the first doping element is annealed and activated to obtain an activated first doping element, a doping concentration of the activated first doping element on the front surface of the substrate 10 is in a range of $5 \times 10^{18}$ atom/cm$^3$ to $1.5 \times 10^{19}$ atom/cm$^3$, an activation rate of the activated first doping element on the front surface of the substrate 10 is in a range of 20% to 40%, and the activation rate is a ratio of the doping concentration of the activated first doping element to a concentration of the first doping element totally implanted.

In some embodiments, the doping concentration of the activated first doping element in the substrate 10 increases first and then decreases as a doping depth of the activated first doping element increases.

In some embodiments, a changing tendency of the concentration of the first doping element totally implanted in the substrate 10 as a doping depth of the first doping element increases is the same as a changing tendency of the doping concentration of the activated first doping element in the substrate 10 as a doping depth of the activated first doping element increases.

In some embodiments, the substrate 10 includes a first region, a second region, and a third region in a depth direction of the front surface of the substrate 10 toward a rear surface of the substrate 10; where the second region is disposed between the first region and the third region, the first region is closer to the front surface of the substrate 10 relative to the second region, and the third region is closer to the rear surface of the substrate 10 relative to the second region; and where a doping concentration of the second doping element in the second region and a doping concentration of the second doping element in the third region are both less than a doping concentration of the second doping element in the first region.

In some embodiments, an interface depth of the first region is in a range of 1.8% to 2.4% of a thickness of the substrate 10, and the interface depth of the first region is a vertical distance between a side of the first region away from the front surface of the substrate 10 and the front surface of the substrate 10.

In some embodiments, the interface depth of the first region is in a range of 350 nm to 450 nm.

In some embodiments, an interface depth of the second region is in a range of to 6.3% of the thickness of the substrate 10, and the interface depth of the second region is in a range of 1000 nm to 1200 nm. An interface depth of the third region is in a range of 6.3% to 8.4% of the thickness of the substrate 10, and the interface depth of the third region is in a range of 1200 nm to 1600 nm.

In some embodiments, the activation rate of the activated first doping element increases first and then decreases as the doping depth increases, an activation rate of the first doping element in the second region is in a range of 60% to 90%, and an activation rate of the first doping element in the third region is in a range of 5% to 90%.

In some embodiments, the photovoltaic cell further includes a tunneling layer 121, a field passivation layer 122 and a second passivation film 123 that are sequentially disposed on a rear surface of the substrate 10, and a second electrode 124, where the second electrode 124 penetrates the second passivation film 123 and is in contact with the field passivation layer 122; where the substrate 10, the tunneling layer 121 and the field passivation layer 122 all include a same first doping element, a doping concentration of the second doping element in the tunneling layer 121 is less than a doping concentration of the second doping element in the field passivation layer 122, and the doping concentration of the second doping element in the tunneling layer 121 is greater than a doping concentration of the second doping element in the substrate 10; where the field passivation layer 122 includes a first doped region and a second doped region, and the second doped region is closer to the tunneling layer 121 relative to the first doped region; where a doping curve slope of the first doped region is greater than a doping curve slope of the second doped region, the second doping element is annealed and activated to obtain an activated second doping element, and the doping curve slope indicates a slope of a curve in which a doping concentration of the activated second doping element changes with a doping depth of the activated second doping element; and where a doping curve slope of the tunneling layer 121 gradually decreases in a depth direction of the tunneling layer 121 toward the substrate 10.

In some embodiments, the doping concentration of the activated second doping element in the field passivation layer 122 is in a range of $1 \times 10^{20}$ atom/cm$^3$ to $5 \times 10^{20}$ atom/cm$^3$, an activation rate of the second doping element in the field passivation layer 122 is in a range of 50% to 70%, and the activation rate is a ratio of the doping concentration of the activated second doping element to a concentration of the second doping element totally implanted.

In some embodiments, the doping curve slope of the first doped region is in a range of $5 \times 10^{18}$ to $1 \times 10^{19}$, and the doping curve slope of the second doped region is in a range of $-5 \times 10^{18}$ to $5 \times 10^{18}$.

In some embodiments, the doping curve slope of the tunneling layer 121 is in a range of $-2.5 \times 10^{18}$ to $-2.5 \times 10^{18}$, and a doping curve slope of the substrate 10 is in a range of $-2.5 \times 10^{19}$ to 0.

Some embodiments of the present disclosure further provide a photovoltaic module including a cell string 101 connected by a plurality of photovoltaic cells, wherein each of the plurality of photovoltaic cells includes the photovoltaic cell according to the above embodiments; an encapsulation layer 102 configured to cover a surface of the cell string 101; and a cover plate 103 configured to cover a surface of the encapsulation layer (102) away from the cell string 101.

Those of ordinary skill in the art should appreciate that the embodiments described above are specific embodiments of the present disclosure, and in practical application, various changes may be made thereto in form and detail without departing from the spirit and scope of the present disclosure. Any one of those skilled in the art may make their own changes and modifications without departing from the spirit and scope of the present disclosure. Therefore, the protection scope of the present disclosure shall be subject to the scope defined in the claims.

What is claimed is:

1. A photovoltaic cell, comprising:
   a substrate; and
   a tunneling layer, a field passivation layer, a first passivation film, and a first electrode that are sequentially disposed on a rear surface of the substrate, wherein the first electrode penetrates the first passivation film and is in contact with the field passivation layer;
   wherein the substrate, the tunneling layer and the field passivation layer all include a same first doping element, a doping concentration of the first doping element in the tunneling layer is less than a doping concentration of the first doping element in the field passivation layer, and the doping concentration of the first doping element in the tunneling layer is greater than a doping concentration of the first doping element in the substrate;
   wherein the first doping element is annealed and activated to obtain an activated first doping element, the field passivation layer includes a first doping region and a second doping region, and the second doping region is closer to the tunneling layer than the first doping region; wherein doping concentration of the activated first doping element in the first doping region varies in a direction from the field passivation layer towards the rear surface of the substrate at a first rate that is positive and is greater than a second rate at which doping concentration of the activated first doping element in the second doping region varies in the direction; and
   wherein doping concentration of the activated first doping element in the tunneling layer varies at a third rate and the third rate gradually decreases along a thickness direction of the tunneling layer toward the substrate,
   wherein the first rate varies in a range of $5 \times 10^{18}$ to $1 \times 10^{19}$ across a thickness of the first doping region, and the second rate varies in a range of $-5 \times 10^{18}$ to $5 \times 10^{18}$ across a thickness of the second doping region.

2. The photovoltaic cell according to claim 1, wherein doping concentration of the first activated doping element in the substrate varies at a fourth rate and the fourth rate gradually increases from a negative value to zero and then becomes stable near zero in a direction from the rear surface of the substrate towards an interior of the substrate.

3. The photovoltaic cell according to claim 2, wherein the fourth rate is less than or equal to an average value of the second rate.

4. The photovoltaic cell according to claim 1, wherein a doping concentration of the activated first doping element in the field passivation layer is in a range of $1\times10^{20}$ atom/cm$^3$ to $5\times10^{20}$ atom/cm$^3$; and
wherein an activation rate of the first doping element in the field passivation layer is in a range of 50% to 70%, and the activation rate is a ratio of the doping concentration of the activated first doping element to a concentration of the first doping element totally implanted.

5. The photovoltaic cell according to claim 2, wherein the third rate is in a range of $-2.5\times10^{19}$ to $-2.5\times10^{18}$, and the fourth rate is in a range of $-2.5\times10^{19}$ to 0.

6. The photovoltaic cell according to claim 1, wherein a thickness of the field passivation layer is in a range of 60 nm to 130 nm in a direction perpendicular to a surface of the substrate, and a thickness of the tunneling layer is in a range of 0.5 nm to 3 nm in the direction perpendicular to the surface of the substrate.

7. The photovoltaic cell according to claim 1, further comprising:
an emitter, a second passivation film, and a second electrode that are sequentially disposed on a front surface of the substrate, wherein the second electrode penetrates the second passivation film and is in contact with the emitter;
wherein the substrate further includes a second doping element.

8. The photovoltaic cell according to claim 7, wherein the substrate includes a first region, a second region, and a third region in a direction along the front surface of the substrate toward the rear surface of the substrate;
wherein the second region is disposed between the first region and the third region, the first region is adjacent to the front surface of the substrate relative to the second region, and the third region is adjacent to the rear surface of the substrate relative to the second region; and
wherein a doping concentration of the second doping element in the second region and a doping concentration of the second doping element in the third region are both less than a doping concentration of the second doping element in the first region;
the second doping element is annealed and activated to obtain an activated second doping element, and a doping concentration of the activated second doping element in the first region of the substrate is in a range of $5\times10^{18}$ atom/cm$^3$ to $1.5\times10^{19}$ atom/cm$^3$; and
wherein a concentration of the second doping element totally implanted in the first region is in a range of $1.5\times10^{19}$ atom/cm$^3$ to $1\times10^{20}$ atom/cm$^3$.

9. The photovoltaic cell according to claim 8, wherein a doping concentration of the activated second doping element in the first region is in a range of $5\times10^{18}$ atom/cm$^3$ to $1.5\times10^{19}$ atom/cm$^3$.

10. The photovoltaic cell according to claim 8, wherein a distance between a rear surface of the first region and the front surface of the substrate is in a range of 350 nm to 450 nm, a distance between a rear surface of the second region and the front surface of the substrate is in a range of 1000 nm to 1200 nm, and a distance between a rear surface of the third region and the front surface of the substrate is in a range of 1200 nm to 1600 nm.

11. The photovoltaic cell according to claim 8, wherein an activation rate of the second doping element in the first region is in a range of 20% to 40%, an activation rate of the second doping element in the second region is in a range of 60% to 90%, and an activation rate of the second doping element in the third region is in a range of 5% to 90%; and
wherein the activation rate is a ratio of the doping concentration of the activated second doping element to the concentration of the second doping element totally implanted.

12. A photovoltaic module, comprising:
a cell string connected by a plurality of photovoltaic cells;
an encapsulation layer configured to cover a surface of the cell string; and
a cover plate configured to cover a surface of the encapsulation layer away from the cell string;
wherein each of the plurality of photovoltaic cells includes:
a substrate; and
a tunneling layer, a field passivation layer, a first passivation film, and a first electrode that are sequentially disposed on a rear surface of the substrate, wherein the first electrode penetrates the first passivation film and is in contact with the field passivation layer;
wherein the substrate, the tunneling layer and the field passivation layer all include a same first doping element, a doping concentration of the first doping element in the tunneling layer is less than a doping concentration of the first doping element in the field passivation layer, and the doping concentration of the first doping element in the tunneling layer is greater than a doping concentration of the first doping element in the substrate;
wherein the first doping element is annealed and activated to obtain an activated first doping element, the field passivation layer includes a first doping region and a second doping region, and the second doping region is closer to the tunneling layer than the first doping region; wherein doping concentration of the activated first doping element in the first doping region varies in a direction from the field passivation layer towards the rear surface of the substrate at a first rate that is positive and is greater than a second rate at which doping concentration of the activated first doping element in the second doping region varies in the direction; and
wherein doping concentration of the activated first doping element in the tunneling layer varies at a third rate and the third rate gradually decreases along a thickness direction of the tunneling layer toward the substrate,
wherein the first rate varies in a range of $5\times10^{18}$ to $1\times10^{19}$ across a thickness of the first doping region, and the second rate varies in a range of $-5\times10^{18}$ to $5\times10^{18}$ across a thickness of the second doping region.

13. The photovoltaic module according to claim 12, wherein doping concentration of the first activated doping element in the substrate of at least one of the plurality of photovoltaic cells varies at a fourth rate and the fourth rate gradually increases from a negative value to zero and then becomes stable near zero in a direction from the rear surface of the substrate towards an interior of the substrate of the at least one of the plurality of photovoltaic cells.

14. The photovoltaic module according to claim 13, wherein the fourth rate is less than or equal to an average value of the second rate.

15. The photovoltaic module according to claim 12, wherein a doping concentration of the activated first doping element in the field passivation layer of at least one of the plurality of photovoltaic cells is in a range of $1\times10^{20}$ atom/cm$^3$ to $5\times10^{20}$ atom/cm$^3$; and wherein an activation rate of the first doping element in the field passivation layer of the at least one of the plurality of photovoltaic cells is in a range of 50% to 70%, and the activation rate is a ratio of the doping concentration of the activated first doping element to a concentration of the first doping element totally implanted.

16. The photovoltaic module according to claim 12, wherein the third rate is in a range of $-2.5\times10^{19}$ to $-2.5\times10^{18}$, and the fourth rate is in a range of $-2.5\times10^{19}$ to 0.

17. The photovoltaic module according to claim 12, wherein a thickness of the field passivation layer of at least one of the plurality of photovoltaic cells is in a range of 60 nm to 130 nm in a direction perpendicular to a surface of the substrate of the at least one of the plurality of photovoltaic cells, and a thickness of the tunneling layer of the at least one of the plurality of photovoltaic cells is in a range of 0.5 nm to 3 nm in the direction perpendicular to the surface of the substrate of the at least one of the plurality of photovoltaic cells.

* * * * *